United States Patent
von Malm et al.

(10) Patent No.: US 10,505,091 B2
(45) Date of Patent: Dec. 10, 2019

(54) COMPONENT AND METHOD OF PRODUCING A COMPONENT

(71) Applicant: OSRAM Opto Semiconductors GmbH, Regensburg (DE)

(72) Inventors: Norwin von Malm, Nittendorf (DE); Frank Singer, Regenstauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 52 days.

(21) Appl. No.: 15/735,990

(22) PCT Filed: Jun. 14, 2016

(86) PCT No.: PCT/EP2016/063622
§ 371 (c)(1),
(2) Date: Dec. 13, 2017

(87) PCT Pub. No.: WO2016/202794
PCT Pub. Date: Dec. 22, 2016

(65) Prior Publication Data
US 2018/0182943 A1    Jun. 28, 2018

(30) Foreign Application Priority Data
Jun. 18, 2015    (DE) .................. 10 2015 109 755

(51) Int. Cl.
*H01L 33/62* (2010.01)
*H01L 33/60* (2010.01)
(Continued)

(52) U.S. Cl.
CPC ............ *H01L 33/62* (2013.01); *G02B 6/0073* (2013.01); *G02B 6/0083* (2013.01);
(Continued)

(58) Field of Classification Search
None
See application file for complete search history.

(56) References Cited

U.S. PATENT DOCUMENTS

| 2008/0101062 A1* | 5/2008 | Feng | H01L 33/486 |
| | | | 362/231 |
| 2010/0157585 A1* | 6/2010 | Diekmann | F21S 6/002 |
| | | | 362/228 |

(Continued)

FOREIGN PATENT DOCUMENTS

| DE | 10 2008 048 259 A1 | 4/2010 |
| DE | 10 2009 032 486 A1 | 1/2011 |

(Continued)

OTHER PUBLICATIONS

Micro SIDELED 3806 Datasheet Version 1.2, CUW Y3SH.B1, OSRAM Opto Semiconductors Nov. 20, 2014.

*Primary Examiner* — Angel Roman
(74) *Attorney, Agent, or Firm* — DLA Piper LLP (US)

(57) ABSTRACT

A component comprising a support and a semiconductor body arranged on the support, the support formed by a molded body and a metal layer. The metal layer has a first subregion and a second subregion laterally spaced apart by an intermediate space and thereby electrically separated. The molded body fills the intermediate space and has a surface extending in lateral directions free from the subregions of the metal layer and forms the rear side of the support. The support has a side face formed by a surface of the molded body extending in vertical directions, at least one of the subregions formed such that electrical contact can be made by way of the side face.

16 Claims, 5 Drawing Sheets

(51) Int. Cl.
  *H01L 33/38* (2010.01)
  *F21V 8/00* (2006.01)
  *H01L 33/00* (2010.01)
  *H01L 33/48* (2010.01)

(52) U.S. Cl.
  CPC ........ H01L 33/0095 (2013.01); H01L 33/382 (2013.01); H01L 33/486 (2013.01); H01L 33/60 (2013.01); *H01L 2933/0066* (2013.01); *H01L 2933/0091* (2013.01)

(56) References Cited

U.S. PATENT DOCUMENTS

| | | | | |
|---|---|---|---|---|
| 2012/0241792 A1* | 9/2012 | Obata | ............... | H01L 33/62 257/98 |
| 2013/0299864 A1* | 11/2013 | Sugizaki | ............... | H01L 33/486 257/98 |
| 2013/0320381 A1* | 12/2013 | Kojima | ............... | H01L 33/486 257/98 |
| 2014/0061698 A1 | 3/2014 | Lin et al. | | |

FOREIGN PATENT DOCUMENTS

| | | |
|---|---|---|
| DE | 10 2010 025 320 A1 | 12/2011 |
| DE | 10 2013 111 977 A1 | 4/2015 |
| EP | 2 312 660 A2 | 4/2011 |
| WO | 2016/078837 A1 | 5/2016 |

* cited by examiner

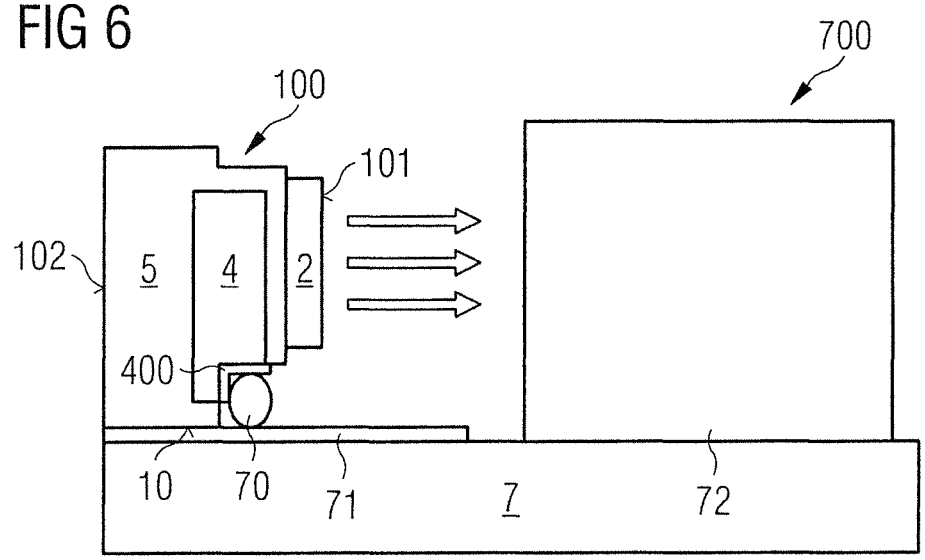

COMPONENT AND METHOD OF PRODUCING A COMPONENT

TECHNICAL FIELD

This disclosure relates to a component and a method of producing one or a plurality of components.

BACKGROUND

Mobile electronic devices with an LCD display comprise a plurality of light-emitting components for backlighting. It is desirable that the weight and installation height of such devices should be kept as small as possible. Efforts should therefore be made to reduce the weight and installation height of the light-emitting components particularly while maintaining their efficiency and radiation power.

It could therefore be helpful to provide a component having a low installation height and high mechanical stability as well as a simplified and, at the same time, inexpensive method of producing one or a plurality of components.

SUMMARY

We provide a component including a carrier and a semiconductor body arranged on the carrier, wherein the carrier has a front side facing towards the semiconductor body and a rear side facing away from the semiconductor body, wherein the carrier is formed from a mold body and a metal layer, the semiconductor body has a first semiconductor layer facing away from the front side of the carrier, a second semiconductor layer facing towards the front side of the carrier and an active layer arranged between the first semiconductor layer and the second semiconductor layer in a vertical direction, the metal layer has a first subregion configured to electrically contact the first semiconductor layer and a second subregion configured to electrically contact the second semiconductor layer, wherein the first subregion is spaced apart laterally from the second subregion by an intermediate space and thereby electrically separated, the mold body fills the intermediate space and has a surface extending in lateral directions that forms the rear side of the carrier, wherein the rear side of the carrier is free from the subregions of the metal layer, and the carrier has a side face formed in places by a surface of the mold body extending in vertical directions, at least one of the subregions being formed such that electrical contact can be made by way of the side face.

We also provide a device having the component including a carrier and a semiconductor body arranged on the carrier, wherein the carrier has a front side facing towards the semiconductor body and a rear side facing away from the semiconductor body, wherein the carrier is formed from a mold body and a metal layer, the semiconductor body has a first semiconductor layer facing away from the front side of the carrier, a second semiconductor layer facing towards the front side of the carrier and an active layer arranged between the first semiconductor layer and the second semiconductor layer in a vertical direction, the metal layer has a first subregion configured to electrically contact the first semiconductor layer and a second subregion configured to electrically contact the second semiconductor layer, wherein the first subregion is spaced apart laterally from the second subregion by an intermediate space and thereby electrically separated, the mold body fills the intermediate space and has a surface extending in lateral directions that forms the rear side of the carrier, wherein the rear side of the carrier is free from the subregions of the metal layer, and the carrier has a side face formed in places by a surface of the mold body extending in vertical directions, at least one of the subregions being formed such that electrical contact can be made by way of the side face, and a printed circuit board, wherein the side face of the carrier is formed as a mounting surface of the component such that the component is attached to the printed circuit board on the side face of the carrier and thereby electrically connected to the printed circuit board, the active layer is configured to generate electromagnetic radiation during operation of the component, and the component has a main emission direction during operation of the device running parallel to the mounting surface and thus to the printed circuit board.

We further provide a method of producing a component including a) providing a composite having a semiconductor layer stack, a metal layer and a mold body composite, wherein the semiconductor layer stack includes at least one semiconductor body having a first semiconductor layer, a second semiconductor layer and an active layer arranged between the first and second semiconductor layers in a vertical direction, the metal layer includes a first subregion that electrically contacts the first semiconductor layer and a second subregion that electrically contacts the second semiconductor layer, wherein the subregions are spaced apart laterally by an intermediate space and thereby electrically separated from one another, and the mold body composite covers the subregions of the metal layer completely in a top view of the semiconductor body and surrounds them entirely in the lateral directions, filling the intermediate space; b) forming at least one trench in the mold body composite starting from the side of the semiconductor layer stack to expose the first and/or second subregion of the metal layer; and c) forming an individual carrier for the one semiconductor body from the mold body composite and the metal layer such that the carrier has a side face formed in places by a side wall of the trench, wherein electrical contact can be made with the exposed subregion of the metal layer on the side face.

BRIEF DESCRIPTION OF THE DRAWINGS

FIGS. 1A to 4A show various method stages of an example of a method of producing one or a plurality of components in schematic sectional views.

FIG. 6 shows an example of a device with a component in a schematic sectional view.

LIST OF REFERENCE NUMBERS

Figure 1A:
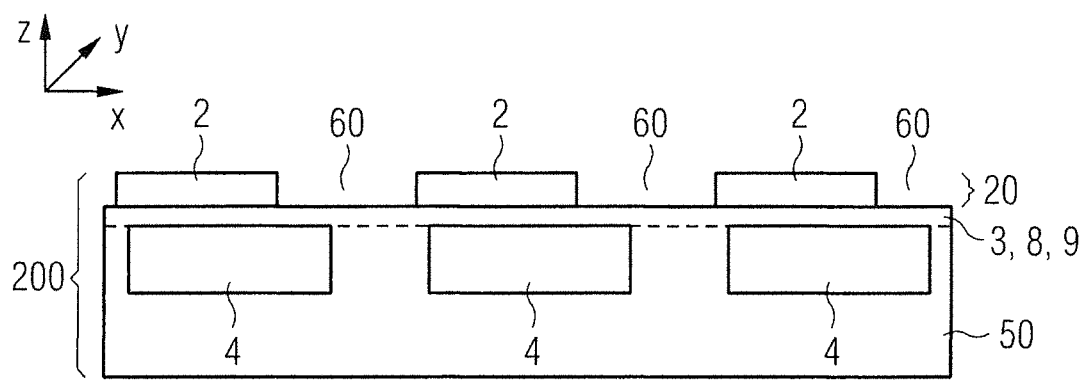

100 Component
101 Radiation passage surface
102 Rear side of the component
1 Carrier
10 Side face of the carrier/component
11 Front side of the carrier
12 Rear side of the carrier
2 Semiconductor body
20 Semiconductor layer stack
21 First semiconductor layer
22 Second semiconductor layer
23 Active layer 200 Composite
201 First main surface of the semiconductor body
202 Second main surface of the semiconductor body
3 Further metal layer
4 Metal layer
40 Intermediate space
41 First subregion of the metal layer
42 Second subregion of the metal layer
400 Contact layer
410 First contact layer
420 Second contact layer
5 Mold body
50 Mold body composite
60 Isolating trench
61 Trench
700 Device for backlighting
7 Printed circuit board
70 Connecting layer
71 Conducting track
72 Light guide
8 Wiring structure
80 Connection layer
81 Electrically conductive layer
811 1st sub-layer of the electrically conductive layer
812 2nd sub-layer of the electrically conductive layer
82 Through-via
9 Insulating structure

DETAILED DESCRIPTION

The component may comprise a carrier and a semiconductor body arranged on the carrier. The carrier has a front side facing towards the semiconductor body and a rear side facing away from the semiconductor body. In particular, the carrier is produced directly on the semiconductor body. This means that the carrier is not, e.g., produced in a production step separate from the semiconductor body and the semiconductor body attached to the carrier, for example, by a connecting layer.

The carrier can be formed from a mold body and a metal layer. The metal layer is configured, e.g., to electrically contact the semiconductor body. The mold body is preferably electrically insulating and formed in particular from an electrically insulating matrix material such as a plastic, e.g., a resin. The mold body can also comprise light-scattering or light-reflecting particles embedded, e.g., in the matrix material of the mold body. The metal layer can be embedded in the mold body so that the rear side of the carrier is, e.g., free from the metal layer. In particular, the rear side of the carrier can be formed exclusively by a surface of the mold body. However, the front side of the carrier can be formed in places by a surface of the mold body and in places by a surface of the metal layer.

The semiconductor body can comprise a first semiconductor layer of a first charge carrier type facing away from the front side of the carrier and a second semiconductor layer of a second charge carrier type facing towards the front side of the carrier. The first semiconductor layer here can be in an n-type form and the second semiconductor layer in a p-type form, or vice versa. Preferably, the semiconductor body contains an active layer preferably configured to detect or emit electromagnetic radiation during operation of the component. In particular, the active layer is arranged between the first and second semiconductor layers in a vertical direction. For example, the active layer is a p-n junction zone, which can be in the form of a layer or a layer sequence of multiple layers.

A vertical direction is understood to mean a direction in particular oriented perpendicularly to a main extension plane of the semiconductor body. In particular, the vertical direction is a growth direction of the semiconductor layers of the semiconductor body. A lateral direction is understood to mean a direction running, e.g., parallel to the main extension plane. In particular, the vertical direction and the lateral direction are oriented transversely, e.g., perpendicularly, to one another.

The metal layer may comprise a first subregion and a second subregion electrically separated from the first subregion. The subregions are electrically separated, e.g., if they are assigned to different electrical polarities of the component. The first subregion can be spaced apart laterally from the second subregion by an intermediate space and thereby electrically separated from the second subregion. To electrically contact the semiconductor body, the first subregion electrically connects, e.g., to the first semiconductor layer and the second subregion, e.g., to the second semiconductor layer of the semiconductor body.

The front side of the carrier facing towards the semiconductor body can be formed in places by surfaces of the first and/or second subregion of the metal layer extending in lateral directions. The first and the second subregion of the metal layer here can, for example, be uncovered by the mold body on the front side of the carrier. The surfaces of the first and/or second subregion of the metal layer not covered by the mold body on the front side of the carrier can be completely covered by the semiconductor body in a top view of the carrier.

The mold body may fill and, in particular completely fill, the intermediate space arranged between the subregions of the metal layer in the lateral direction. The mold body can comprise a surface extending in lateral directions that forms the rear side of the carrier, wherein the rear side of the carrier is in particular free from openings and free from the subregions of the metal layer. In a top view of the front side from the rear side, the mold body can cover the metal layer and/or the semiconductor body completely.

The carrier may comprise a side face. In particular, the side face of the carrier is formed in places, e.g., by a surface of the mold body extending in vertical directions. The mold body and the metal layer here are formed in particular such that external electrical contact can be made with the first subregion and/or the second subregion by way of the side face of the carrier. The side face of the carrier here can comprise regions formed, e.g., by a surface of the first subregion and/or by a surface of the second subregion. On the side face of the carrier, the subregions of the metal layer can comprise surfaces with which electrical contact can be made, which are preferably free from a material of the mold body. The electrically contactable surfaces of the first subregion and/or of the second subregion can be covered by an electrically conductive protective layer, e.g., in the form of a contact layer.

The protective layer comprises, for example, a precious metal, e.g., gold or silver. The protective layer can completely cover the surfaces of the metal layer not covered by a material of the mold body and are electrically contactable on the side face so that the metal layer is protected, e.g., from environmental influences such as moisture or oxygen, as a result of which oxidation of the metal layer, e.g., of the exposed surfaces of the subregions on the side face of the carrier, is prevented.

The component may be in the form of an optoelectronic part. In this case, the part can be in the form of an actuator (transmitter) or a detector (receiver) or a combination of at least one actuator and at least one detector (opto-coupler). In particular, the component is configured as a light-emitting diode (LED).

The component may comprise a carrier and a semiconductor body arranged on the carrier. The carrier has a front side facing towards the semiconductor body and a rear side facing away from the semiconductor body. The semiconductor body comprises a first semiconductor layer facing away from the front side of the carrier, a second semiconductor layer facing towards the front side of the carrier and an active layer arranged between the first and second semiconductor layers in the vertical direction. The carrier is formed in particular from a mold body and a metal layer. The metal layer has a first subregion configured to electrically contact the first semiconductor layer and a second subregion configured to electrically contact the second semiconductor layer, the first subregion being spaced apart laterally from the second subregion by an intermediate space and thereby electrically separated. The mold body can fill the intermediate space and can have a surface extending in lateral directions forming the rear side of the carrier. The rear side of the carrier is thus in particular free from the subregions of the metal layer. The carrier has a side face formed at least in places by a surface of the mold body extending in vertical directions. At least one of the subregions of the metal layer is formed such that it can be electrically contacted by way of the side face.

In such a configuration of the component, the side face of the carrier can be formed as a mounting surface of the component. By way of the side face formed as a mounting surface, external electrical contact can be made with the component. Preferably, both the first subregion and the second subregion of the metal layer are formed such that external electrical contact can be made with them by way of the side face of the carrier. In this way, the component can be attached to and electrically contacted with a printed circuit board on the side face. The total installation height of the component in this case is not the total height of, e.g., a vertical height of the carrier and a vertical height of the semiconductor body but a lateral width of the component, which is oriented, e.g., transversely, in particular perpendicularly, to the growth direction of the semiconductor body. The total installation height can therefore be adjusted more easily during production of the component since, in contrast to the vertical dimension of the component, the lateral dimension is established, e.g., only during a singulating process. The mounting surface of the component in this case runs substantially parallel to the growth direction of the semiconductor layers of the semiconductor body. A main emission direction of the component can also be adjusted such that it runs, e.g., parallel to the side face of the carrier which is formed as a mounting surface of the component so that the component is preferably in the form of a sidelooker.

A component of this type can have a particularly low installation height, which is, e.g., 50 to 200 µm, in particular 50 to 150 µm or, e.g., between 50 to 100 µm. The installation width can also be kept particularly low.

The side face may have a step, wherein at least one of the subregions is formed on the step such that it can be electrically contacted externally. In particular, both the first subregion and the second subregion of the metal layer are formed on the step such that they can be electrically contacted externally. With a step on the side face, the protective layer can be deposited on the side face more easily. A mounting of the component, for example, on a printed circuit board can also be implemented more easily, e.g., by forming a connecting layer, in particular in the form of a solder layer, in the region of the step between the component and the printed circuit board, as a result of which the total installation height is barely, or is not, increased by the connecting layer.

The component may have a further metal layer arranged between the semiconductor body and the metal layer in a vertical direction. In a top view, the further metal layer can laterally bridge the intermediate space arranged between the subregions, thus mechanically reinforcing the component in areas of the intermediate space. The further metal layer here can cover a large part of the intermediate space, e.g., at least 60%, at least 70% or preferably at least 90% of the intermediate space. Possible mechanical weak spots in the region of the intermediate space can be avoided by the further metal layer.

The further metal layer here can be formed coherently and can likewise be configured to electrically contact the semiconductor body. For example, the further metal layer electrically connects to the first subregion or to the second subregion of the metal layer. The further metal layer can also be formed as part of the carrier. In particular, the further metal layer is formed on the semiconductor body by a coating method before the metal layer is deposited, e.g., on the further metal layer and on the semiconductor body.

The component may have a through-via. The through-via can be located in the semiconductor body in places and extend, e.g., through the second semiconductor layer and the active layer in the vertical direction for electrically contacting the first semiconductor layer. In the semiconductor body, the through-via can be entirely surrounded in the lateral directions by the semiconductor body. The through-via here can electrically connect to the first subregion of the metal layer. In this case, the through-via can electrically connect to the further metal layer or be electrically separated from the further metal layer. To improve current distribution, the component can also have a plurality of these through-vias.

Our device for backlighting may comprise a component and a printed circuit board. The component here is in particular in the form of a sidelooker. A side face of the carrier or the component here is preferably formed as a mounting surface of the component so that the component can in particular be attached to the printed circuit board on the side face and thereby electrically connected to the printed circuit board. For example, the component mechanically, and preferably also electrically, connects to the printed circuit board by a connecting layer. The connecting layer can be in an electrically conductive form, e.g., in the form of a solder layer, for example, in the form of a solder ball. The subregions of the metal layer on the side face here can electrically connect to conducting tracks on the printed circuit board, e.g., by the electrically conductive connecting layer. Preferably, the active layer of the semiconductor body is configured to generate electromagnetic radiation, e.g., in the visible, infrared or ultraviolet range of the spectrum, during operation of the component. During operation of the device, the component has a main emission direction that in particular runs parallel to the mounting surface and thus parallel to the printed circuit board.

The device can be in the form of a display backlight, wherein the device comprises, e.g., a light guide with a light entry surface. The component and the light guide are in particular arranged in relation to one another such that the main emission direction of the component is oriented approximately perpendicularly to the light entry surface of the light guide. The component and the light guide can have a substantially equal installation height.

A use of a component as described here, which is in the form of, e.g., a sidelooker, in a device for display backlighting can reduce the installation height of the device significantly without having a negative impact on the efficiency or radiation power of the component. With the use of a component as described here, the installation height of the device can achieve a total height of approximately 200 μm or less.

In our method of producing one or a plurality of components, a composite with a semiconductor layer stack, a metal layer and a mold body composite may be provided. The semiconductor layer stack comprises at least one semiconductor body with a first and a second semiconductor layer and an active layer arranged between the first and second semiconductor layers in the vertical direction. The semiconductor layer stack can comprise a plurality of the laterally spaced apart semiconductor bodies, wherein the semiconductor layer stack can initially be formed coherently, e.g., grown epitaxially on a growth substrate, and patterned in a subsequent method step into a plurality of semiconductor bodies arranged side by side.

The metal layer can comprise a first subregion to electrically contact the first semiconductor layer and a second subregion to electrically contact the second semiconductor layer, wherein the subregions are spaced apart laterally, e.g., by an intermediate space and thereby electrically separated from one another. The composite can also comprise a plurality of the metal layers, wherein the metal layers are each preferably assigned to a semiconductor body. The metal layer or layers can be deposited on the semiconductor layer stack preferably in a patterned manner, e.g., by an electroplating or an electroless coating method.

The mold body composite covers, and in particular completely covers, the subregions of the metal layer in a top view of the semiconductor body from the carrier. In the lateral directions, the mold body composite can entirely surround the subregions of the metal layers or the metal layers. The intermediate space or spaces between the subregions of the respective metal layer are in particular filled by the mold body composite. The mold body composite can be deposited on and around the metal layer or layers, e.g., by a molding method, preferably by compression molding or a pellet molding method. In particular, the mold body composite is formed on the semiconductor layer stack, i.e., in the wafer composite, e.g., at wafer level. The mold body composite here is formed in particular from a plastic, e.g., in the form of a potting compound.

A molding method means in general a method by which a molding compound can be configured according to a predefined shape and, if necessary, cured. In particular, the term "molding method" includes molding, film assisted molding, injection molding, transfer molding and compression molding.

After the mold body has been deposited, the growth substrate can be removed from the semiconductor layer stack or the semiconductor body so that the component to be produced is preferably free from a growth substrate. Removal of the growth substrate can take place mechanically, e.g., by grinding, chemically, e.g., by etching, or by a laser lift-off method. The semiconductor layer stack can then be patterned into a plurality of semiconductor bodies. It is also possible that the semiconductor layer stack is patterned into a plurality of semiconductor bodies, e.g., from a side of the semiconductor layer stack facing away from the growth substrate before or after the removal of the growth substrate.

At least one trench may be formed in the mold body composite, starting from the side of the semiconductor layer stack, to expose the first and/or second subregion of the metal layer. A plurality of the trenches can also be formed in the mold body composite to expose a plurality of subregions of the metal layer or layers. A mechanical method such as sawing can be used here.

After formation of the trench or trenches, an individual carrier or a plurality of individual carriers can be formed, wherein the individual carrier is formed from the mold body composite and the metal layer and assigned, e.g., to a semiconductor body, which it supports mechanically. In particular, the carrier is formed such that it has a side face formed at least in places by a side wall of the trench and electrical contact can be made with the subregion of the metal layer freed from the mold body on the side face. The exposed subregion of the metal layer here can be covered by an electrically conductive protective layer on the side face.

The composite may be provided with a plurality of laterally spaced apart metal layers and semiconductor bodies. The composite here can comprise a plurality of isolating trenches between the semiconductor bodies of the component to be produced. A plurality of trenches can be formed in the mold body composite along the isolating trenches and, e.g., beside the semiconductor bodies or beside the respective active layers so that a plurality of first and/or second subregions are exposed on side walls of the trenches. The trench here can partly extend into the metal layer, e.g., into the first and/or second subregion. This means that the metal layer or layers can be cut and/or partly removed during formation of the trench or trenches. It is also possible that the trench or the plurality of trenches is/are formed in the mold body composite only deeply enough for the metal layer or the plurality of metal layers to be exposed in places.

After exposure of the first and/or second subregions, the composite can be singulated into a plurality of components such that the singulated components each comprise an individual carrier and a semiconductor body arranged on the carrier. The individual carrier can be formed from the singulated mold body composite and one of the metal layers with a first and second subregion. In particular, the mold body composite is formed coherently, preferably in one piece (i.e., produced in a single method step) before being singulated. In particular, singulating the composite into a plurality of components takes place exclusively through the mold body composite, the metal layers not being damaged, e.g., not being cut, during singulation.

The trench or the plurality of trenches may be formed before formation of the individual carrier such that both the side wall and a bottom face of the trench are formed by a surface of the first subregion and/or a surface of the second subregion. It is possible here that the first and/or second subregion is/are, e.g., cut or sawn during formation of the trench, and thereby partly removed. The first and/or second subregion here can have a step on a side surface. In a lateral direction, the step can be flat or curved. In particular, the step has a surface extending in the lateral direction which, for example, has the shape of a curved indentation and thus a continuous radius other than zero. An indentation of this type can form an anchoring structure, e.g., for a connecting layer so that a material of the connecting layer can engage in the anchoring structure, thus increasing the mechanical stability of a connection of the component, e.g., to a printed circuit board. The step of the first and/or second subregion here can be part of the step of the side face of the carrier of the component to be produced. The step, formed on the side face of the carrier, e.g., by surfaces of the mold body composite and the metal layer, can entirely surround the component to be produced here.

Before formation of the individual carrier, e.g., before the composite is singulated into a plurality of components, an electrically conductive contact layer can be deposited on the exposed first and/or second subregion of the metal layer. The contact layer preferably contains a precious metal such as, e.g., silver or gold. In particular, the contact layer comprises a nickel-palladium-gold alloy or a layer stack based thereon. The contact layer here can cover the exposed subregion of the metal layer completely. In particular, the contact layer covers both a vertical and a lateral surface of the first and/or second subregion and thus the step of the metal layer. The contact layer here can itself have the shape of a step. The contact layer can be deposited on the rear side of the carrier by electroplating or electroless deposition.

The composite may be sawn both when the trenches are formed and during singulation. In particular, a first saw cut of the trenches is produced sufficiently widely that the composite is singulated by a narrower saw cut within the first saw cut without cutting the metal layer.

The method described above is particularly suitable for production of a component as described here. Features described in connection with the component can therefore also be referred to for the method and vice versa.

Further advantages, preferred structures and developments of the method and the component can be taken from the examples explained below in association with FIGS. 1A to 6.

Identical or similar elements or elements having the same effect are provided with the same reference numbers in the figures. The figures are all schematic diagrams and therefore not necessarily to scale. Rather, the size of relatively small elements, and in particular layer thicknesses, may be exaggerated for the sake of clarity.

FIG. 1A shows a composite 200 in a schematic sectional view in an XZ plane, wherein X denotes a lateral direction and Z a vertical direction.

The composite comprises a semiconductor layer stack 20. The semiconductor layer stack 20 can initially be formed coherently and, in a subsequent method step, divided into a plurality of semiconductor bodies 2 arranged, e.g., side by side, for example, by forming one or a plurality of isolating trenches 60. The semiconductor bodies 2 here can be arranged in a matrix shape with a plurality of rows and columns. The semiconductor layer stack 20 can be deposited on a growth substrate (not illustrated in FIG. 1A) by an epitaxial method, preferably in layers. The growth substrate can be removed from the semiconductor layer stack 20 or the semiconductor bodies 2 in a subsequent method step so that the component to be produced is, in particular, free from a growth substrate.

In FIG. 1A, the semiconductor layer stack 20 is arranged on a mold body composite 50. The mold body composite can be formed coherently and deposited on the semiconductor layer stack 20, e.g., by a molding method. In particular, the mold body composite 50 is formed before the semiconductor layer stack 20 is patterned into a plurality of semiconductor bodies 2. For example, the mold body composite 50 is formed from an electrically insulating plastic, e.g., resin such as epoxy resin, silicone resin or acrylates. The mold body composite 50 can contain light-scattering and/or light-reflecting particles, e.g., of silicon oxide or titanium oxide.

FIG. 1A shows a plurality of metal layers 4 spaced apart from one another in the lateral direction. In particular, each metal layer 4 is assigned to a semiconductor body 2. The metal layer 4 is configured to electrically contact the corresponding semiconductor body 2. In other words, the metal layer 4 can indirectly or directly electrically connect to a semiconductor body 2. The metal layer 4 is completely surrounded by the mold body composite 50 in lateral directions in FIG. 1A. In a top view of the semiconductor bodies 2, the mold body composite 50 covers the metal layers 4 completely. In the vertical direction, further layers, e.g., a further metal layer 3, a wiring structure 8 and/or an insulating structure 9, can be arranged between the semiconductor bodies 2 and the mold body composite 50.

In a top view, the semiconductor body 2 overlaps the metal layer 4 assigned thereto. The isolating trench 60 or the plurality of isolating trenches 60 each have a bottom face, which is in particular free from a material of the semiconductor bodies 2 or the semiconductor layer stack 20. The semiconductor bodies 2, the isolating trenches 60 and the metal layers 4 are arranged such that a bottom face of the respective isolating trench 60 partly overlaps a metal layer 4 in a top view, wherein the bottom face of the isolating trench 60 is free from the semiconductor bodies 2. In FIG. 1A, the respective metal layer 4 overlaps both a semiconductor body 2 and an isolating trench 60 in a top view.

Figure 1B:
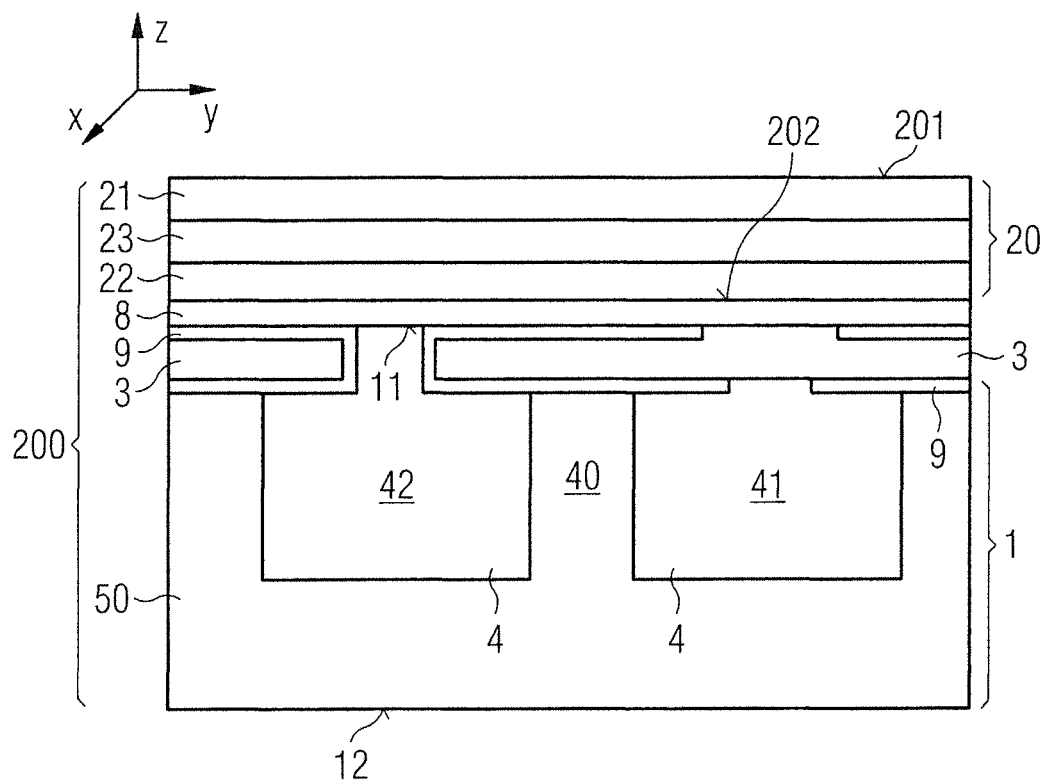

FIG. 1B shows the composite 200 in a schematic sectional view in a YZ plane, wherein Y is a further lateral direction oriented, e.g., transversely, in particular perpendicularly, to the lateral X direction.

FIG. 1B shows that the mold body composite 50 and the metal layer 4 form a carrier 1 for a semiconductor body 2 to be produced. The carrier 1 has a front side 11 facing towards the semiconductor body 2 and a rear side 12 facing away from the semiconductor body 2. The rear side 12 is formed in particular by a surface of the mold body composite 50. The rear side 12 here is free from the metal layer 4. The front side 11 of the carrier can be formed in places by a surface of the metal layer 4.

The semiconductor layer stack 20 or the semiconductor body 2 has a first main surface 201 facing away from the carrier 1 and a second main surface 202 facing towards the carrier 1. In particular, the first main surface 201 is formed by a surface of a first semiconductor layer 21 and the second main surface 202 by a surface of a second semiconductor layer 22 of the semiconductor layer stack 20. In particular, the first semiconductor layer 21 is an n-type semiconductor layer and the second semiconductor layer 22 a p-type semiconductor layer, or vice versa. The semiconductor layer stack 20 additionally has an active layer 23 arranged between the first semiconductor layer 21 and the second semiconductor layer 22.

The composite 200 has a wiring structure 8 on the side of the second main surface 202. The wiring structure 8 is configured to electrically contact the semiconductor body 2, wherein the wiring structure 8 can electrically connect directly or indirectly to various semiconductor layers of the semiconductor body 2. The wiring structure 8 is arranged, e.g., between the semiconductor body 2 and the carrier 1, wherein the wiring structure 8 can comprise subregions that can be electrically separated from one another, e.g., by an insulating structure 9 and thus assigned to different electrical polarities of the component 100 to be produced. In FIG. 1B, the wiring structure 8 and the insulating structure 9 are illustrated in greatly simplified form. Deviating from FIG. 1B, the wiring structure 8 can, for example, extend into the semiconductor body 2 in places. The insulating structure 9 can also extend into the wiring structure 8 and/or the semiconductor body 2 in places.

The metal layer 4 comprises a first subregion 41 configured, e.g., to electrically contact the first semiconductor layer 21. A second subregion 42 of the metal layer 4 is spaced apart from the first subregion 41 in the lateral direction by an intermediate space 40 and thus electrically separated therefrom. The second subregion 42 is configured, e.g., to electrically contact the second semiconductor layer 22. The subregions 41 and 42 are thus assigned to different electrical polarities of the component to be produced and electrically connect to the respective semiconductor layers 21 and 22 of the semiconductor layer stack 20 or of the semiconductor body 2, e.g., by way of the wiring structure 8. The metal layer 4 with the subregions 41 and 42 can comprise or consist of a metal, preferably copper.

In FIG. 1B, the composite 200 comprises a further metal layer 3. The further metal layer 3 can preferably be deposited on the semiconductor layer stack 20 in a patterned manner, e.g., by an electroplating method. In particular, the further metal layer 3 contains a metal, e.g., nickel or copper. In the vertical direction, the further metal layer 3 is arranged between the semiconductor layer stack 20 and the metal layer 4. In a top view, the intermediate space 40 is bridged laterally by the further metal layer 3. In particular, the intermediate space 40 can be largely or completely covered by the further metal layer 3. The composite 200 can comprise a plurality of the further metal layers 3 each of which are assigned, e.g., to a semiconductor body 2 and are therefore in particular spaced apart laterally from one another.

In FIG. 1B, the further metal layer 3 and the insulating structure 9 have a common opening through which the second subregion 42 extends to the wiring structure 8. The insulating structure 9 has an opening through which the first subregion 41 extends to form an electrical contact with the further metal layer 3. The insulating structure 9 has a further opening through which the further metal layer 3 extends to the wiring structure 8. The further metal layer 3 and the second subregion 42 can each electrically connect to different subregions of the wiring structure 8, wherein the subregions of the wiring structure 8 are electrically separated from one another, e.g., by the insulating structure 9 and thus assigned to different electrical polarities of the component to be produced.

The metal layer 4 and/or the further metal layer 3 can each be deposited on the semiconductor layer stack 20 by an electroplating or electroless coating method. In particular, the further metal layer 3 has an average vertical thickness, e.g., smaller than an average vertical thickness of the metal layer 4. The further metal layer 3 is in particular formed sufficiently thickly that it is mechanically stable, preferably self-supporting, and thus contributes to the mechanical stabilizing of the semiconductor layer stack 20 or of the component to be produced, particularly in areas of the intermediate space 40. In FIG. 1B, the intermediate space 40 is completely filled by a material of the mold body composite 50. In the lateral directions, the subregions 41 and 42 of the metal layer 4 are thus entirely surrounded by the mold body composite 50. The subregions 41 and 42 each have a surface facing away from the semiconductor layer stack 20, which is completely covered by the mold body composite 50.

Figure 2:
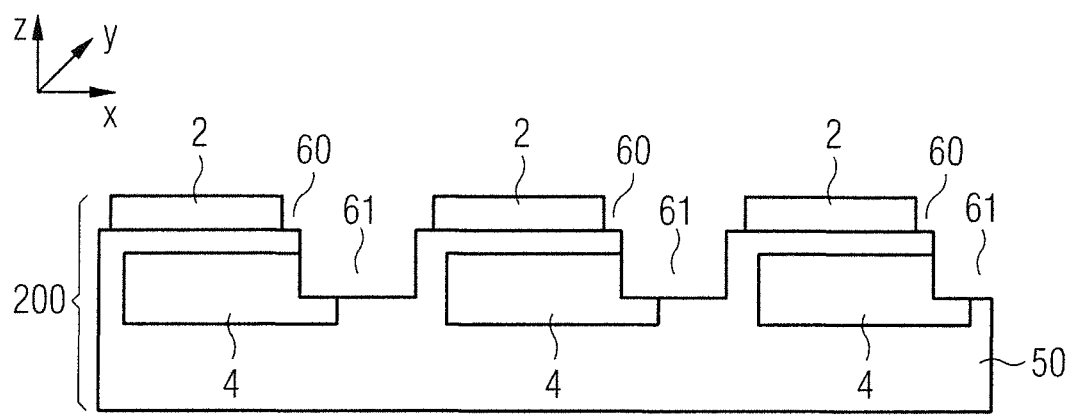

In FIG. 2, a plurality of trenches 61 are formed along the isolating trenches 60, e.g., by a mechanical separating method, for example, by sawing. The isolating trench 60 has a lateral width, e.g., greater than a lateral width of the associated trench 61 formed in the isolating trench. The isolating trench 61 is arranged, e.g., between two semiconductor bodies 2 or between two rows of semiconductor bodies 2. Thus, the trench 61 or the plurality of trenches 61 is/are each located beside the semiconductor bodies 2. In particular, the plurality of trenches 61 are formed exclusively in the regions of the isolating trenches 60 so that the layer stack 20 is not or is no longer removed or cut when the trenches 61 are formed.

The trench 61 or the plurality of trenches 61 is/are formed in the mold body composite 50 in particular such that the first subregion 41 and/or the second subregion 42 of the metal layer 4 is/are partly exposed in the trench 61. The mold body composite 50 can be removed in some regions from the side of the semiconductor layer stack 20, e.g., by sawing to form the trench 61. The corresponding metal layer 4 can likewise be partly removed in this case so that a side wall and/or a bottom face of the trench 61 is formed by an exposed surface of the metal layer 4, in particular a surface of the first subregion 41 and/or of the second subregion 42. As a result of formation of the trench 61, the first subregion 41 and/or the second subregion 42 can each have a side face, e.g., in the form of a step. A bottom face of the trench 61 here can be formed in places by a surface of the metal layer 4 and in places by a surface of the mold body composite 50.

Figure 3:
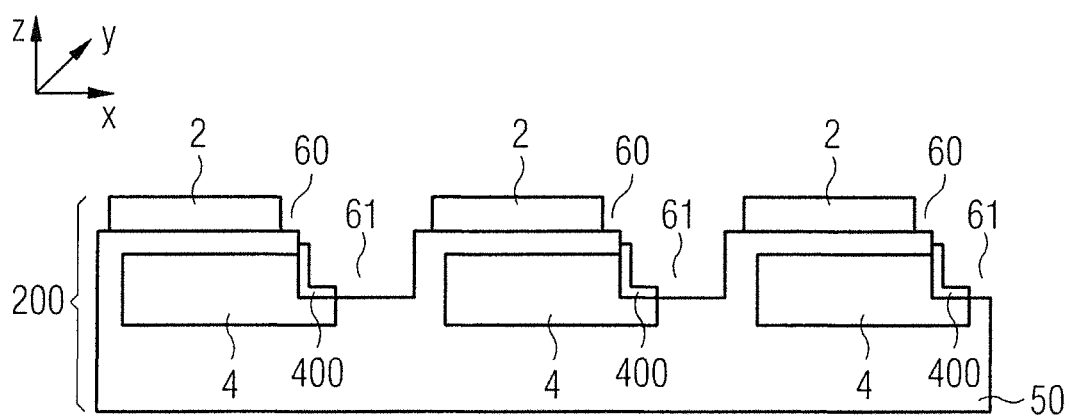

In FIG. 3 a protective layer 400, e.g., in the form of a contact layer 400, is deposited on the surface of the metal layer 4 exposed in the trench 61. The contact layer 400 preferably completely covers the exposed surface as a result of which the metal layer 4 is protected, e.g., from environmental influences such as moisture or oxygen. An oxidation of the metal layer 4 or the subregions 41 and 42 can thereby be prevented. In particular, the contact layer 400 is in the form of a solderable contact layer. The contact layer 400 here contains in particular a precious metal such as silver or gold. For example, the contact layer is an NiPdAu layer. The contact layer 400 here can be deposited on the exposed, e.g., cut surfaces of the subregions 41 and 42 of the metal layer 4 by an electroplating or preferably by an electroless coating method.

Figure 4A:
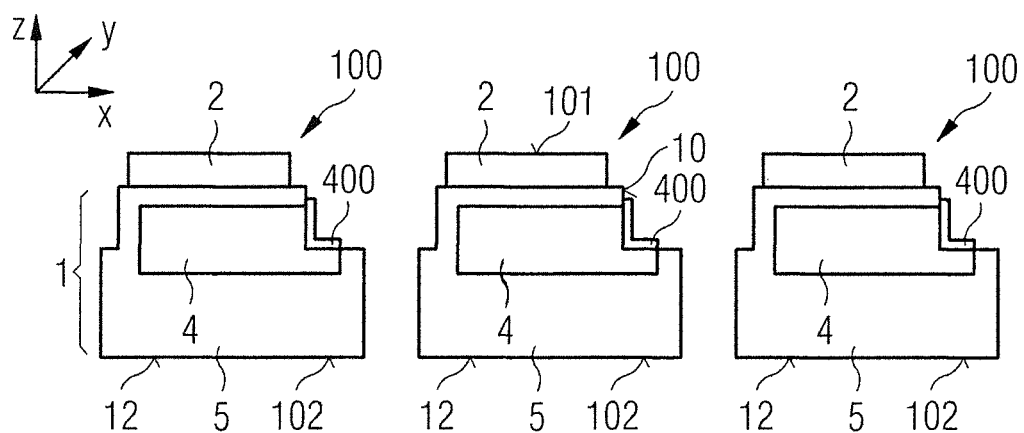

According to FIG. 4A, the composite 200 is singulated into a plurality of components 100. The singulating takes place, e.g., along the trenches 61, in particular exclusively along the regions free from the metal layer 4 so that the metal layer 4 is not removed, e.g., sawn or cut, during the singulation. This means that, during singulation, preferably only the mold body composite 50 is singulated. As a result, metal residues such as copper residues can be prevented from reaching the semiconductor bodies 2 during singulation and possibly damaging the component 100 to be produced. Furthermore, in this way the protective layer 400 is not damaged.

Figure 4B:
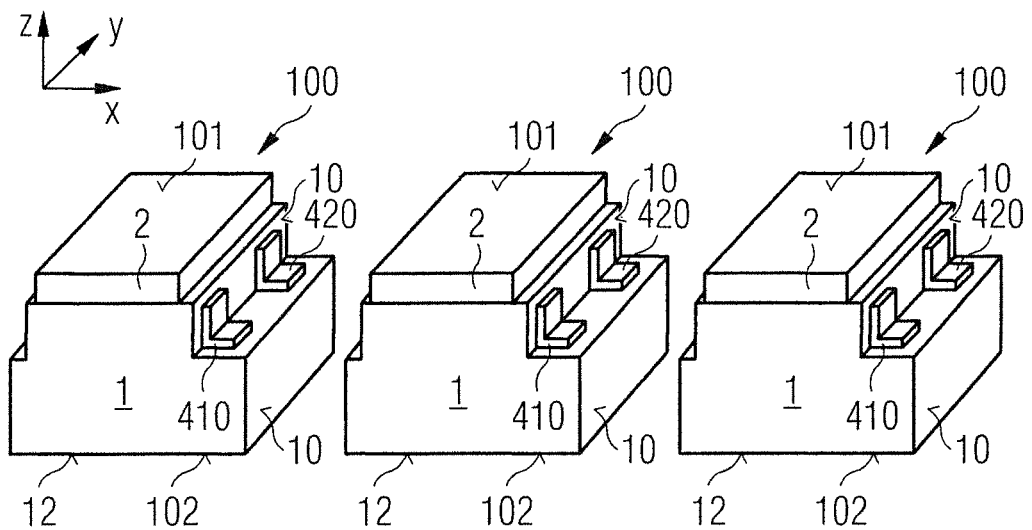
FIG. 4B shows a schematic diagram of an example of components.

In FIG. 4B, a plurality of singulated components 100 are illustrated schematically in both the lateral X direction and the lateral Y direction.

The components 100 each have a radiation passage surface 101 formed, e.g., by a surface of the semiconductor body 2, in particular by the first main surface 201, or by a surface of a protective layer arranged on the semiconductor body 2. The component is thus in the form of a surface emitter. The component 100 has a rear side 102 formed in particular by the rear side 12 of the carrier 1. The carrier 1 comprises a mold body 5 obtained from the mold body composite 50 during singulation, and a metal layer 4 with a first subregion 41 and a second subregion 42 (not illustrated here). On a side face 10 of the carrier or of the component 100, the first subregion 41 electrically connects, e.g., to a first contact layer 410 and can thus be electrically contacted externally. The second subregion 42 can electrically connect to a second contact layer 420 on the same side face 10. By way of the first contact layer 410 and the second contact layer 420, the component 100 can be contacted with an external voltage source, i.e., electrically contacted externally. External electrical contact can thus be made with the component 100 on a side face 10 according to FIG. 4B. In addition, the side face 10 with the contact layers 410 and 420 has a step on which the contact layers 410 and 420 are arranged.

Deviating from FIG. 4B, the component 100 can be formed such that electrical contact can be made with the first subregion 41 on a first side face 10 and with the second subregion 42 on a second side face 10 of the carrier 1 or of the component 100, wherein the first side face borders the second side face or is opposite the second side face. In other words, the component 100 can be configured such that external electrical contact can be made therewith by way of two opposite or two adjacent side faces 10.

The component here can have a lateral width along the X direction which is, for example, 50 µm to 250 µm, e.g., 50 µm to 200 µm or 50 µm to 100 µm. If the side face 10 running in the YZ plane is formed as, e.g., a mounting surface of the component, the installation height of the component is the lateral width along the X direction. For example, a ratio of the proportion of the step to the overall width along the X direction is ⅒ to ⅓, e.g., ⅒ to ⅕. The component 100 has a lateral length along the Y direction which is in particular greater, e.g., at least 2, 4 or 6 times greater, than the lateral width along the X direction. The component 100 has a vertical height along the Z direction which is in particular greater than the lateral width along the X direction. In particular, the vertical height can be greater than the lateral length along the Y direction. The vertical height is, e.g., at least 500 µm, e.g., at least 800 µm or at least 1 mm. The contact layers 410 and 420 can each have a lateral length along the Y direction which is, e.g., 50 µm to 150 µm, e.g., 100 µm. A distance between the contact layers 410 and 420 along the Y direction can be 100 µm to 300 µm, e.g., 200 µm.

Figure 5A:
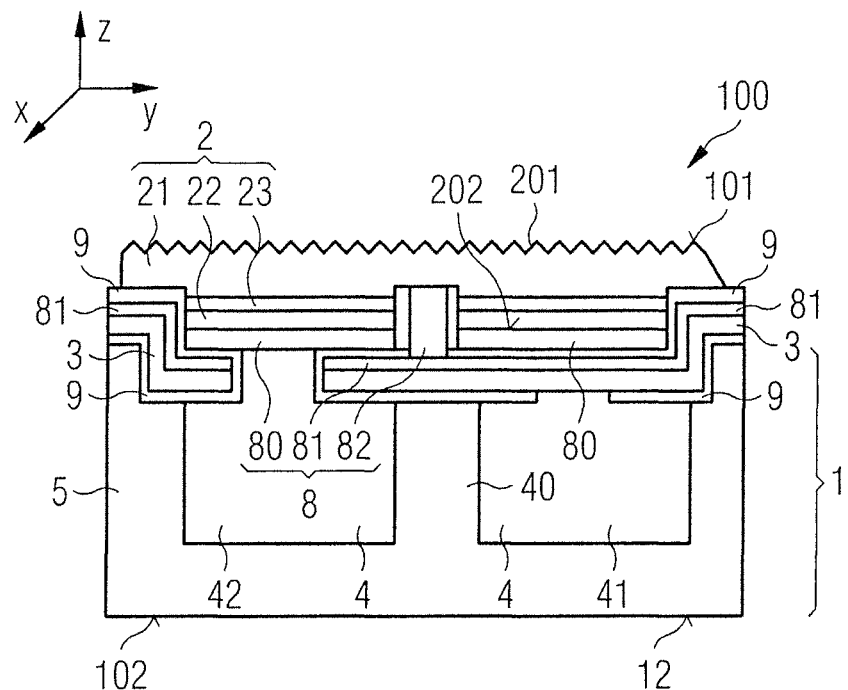
FIGS. 5A to 5B show examples of a component in schematic sectional views.

In FIG. 5A, a cross-section of a component 100 as shown in FIG. 4B is shown in the YZ plane. The cross-section shown in FIG. 5A substantially corresponds to the cross-section shown in FIG. 1B. In contrast thereto, the component 100 has a patterned radiation passage surface 101. The insulating structure 9 and the wiring structure 8 are also shown in somewhat more detail.

In FIG. 5A, the further metal layer 3 is electrically separated from one of the subregions 41 and 42 (in this case from the second subregion 42) by the insulating structure 9. The insulating structure 9 has an opening, through which the first subregion 41 extends to form an electrical contact with the further metal layer 3. In FIG. 5A, the further metal layer 3 and the insulating structure 9 have a common opening through which the second subregion 42 extends to form an electrical contact with a connection layer 80 of the wiring structure 8. The wiring structure 8 here additionally comprises an electrically conductive layer 81 and a through-via 82. The connection layer 80 is electrically separated from the electrically conductive layer 81 and from the through-via 82 by the insulating structure 9.

The connection layer 80 is in particular in the form of a current-spreading layer and electrically connected, e.g., to the second semiconductor layer 22 as a result of which the second semiconductor layer 22 can be uniformly supplied with current. Preferably, the connection layer 80 covers a large part of the active layer 23, e.g., at least 50%, preferably at least 70% or at least 90% of the active layer 23. Preferably, a material of the connection layer 80 is selected such that it acts simultaneously as a diffusion barrier layer. In this case, the connection layer 80 can, e.g., completely cover an opening of the insulating layer 9 through which opening the second subregion 42 or the further metal layer 3 extends so that a migration of metal particles, e.g., metal atoms or metal ions such as copper atoms or copper ions contained in the metal layer 4 or in the further metal layer 3, into the semiconductor body 2 is prevented.

The electrically conductive layer 81 is in particular in the form of a mirror layer and can contain a metal such as aluminum, rhodium, palladium, silver or gold. The electrically conductive layer 81 here covers the active layer 23 in a top view at least in places. The electrically conductive layer 81 can extend along the vertical direction beside the semiconductor body 2 sufficiently far that it surrounds the second semiconductor layer 22 or the active layer 23 laterally. Electromagnetic radiation emitted from the semiconductor body 2 laterally or backwards can thus be reflected back again in the direction of the active layer 23 or in the direction of the radiation passage surface 101 of the component, thus increasing the efficiency of the component. In FIG. 5A, the electrically conductive layer 81 can be formed coherently.

The through-via 82 electrically connects to the further metal layer 3 by way of the electrically conductive layer 81. To make electrical contact with the first semiconductor layer 21, the through-via 82 extends at least from the second main surface 202, in particular from the electrically conductive layer 81, through the second semiconductor layer 22 and the active layer 23 into the first semiconductor layer 21. The through-via 82 can be formed using the same material as the electrically conductive layer 81. The electrically conductive layer 81 and/or the further metal layer 3 can pierce through the side faces 10 of the component 100 at least in places. Alternatively, the component 100 can be formed such that its side faces 10 are metal-free, e.g., with the exception of the subregions 41 and 42 and/or the contact layers 400, 410 and 420.

The insulating structure 9 in FIG. 5A is illustrated schematically in a simplified form and can comprise electrically insulating sub-layers formed, e.g., in separate method steps. For example, the insulating structure 9 comprises an electrically insulating material such as silicon oxide, e.g., silicon dioxide, and/or silicon nitride or consists of at least one of these materials. The insulating structure 9 can contain light-reflecting and/or light-scattering particles. The metal layer 4 with the subregions 41 and 42 can be formed such that, in a top view of the radiation passage surface 101 from the rear side 102, the metal layer 4 covers, e.g., at least 40%, for example, at least 50%, 60% or at least 70% of the semiconductor body 2. As a result of this configuration of the metal layer 4, the component can be configured in a particularly stable manner. In addition, the component 100 can be controlled in terms of heat dissipation, e.g., by a direct thermal connection with the contact layer 400, which can likewise be of a flat configuration on the side face 10.

Figure 5B:
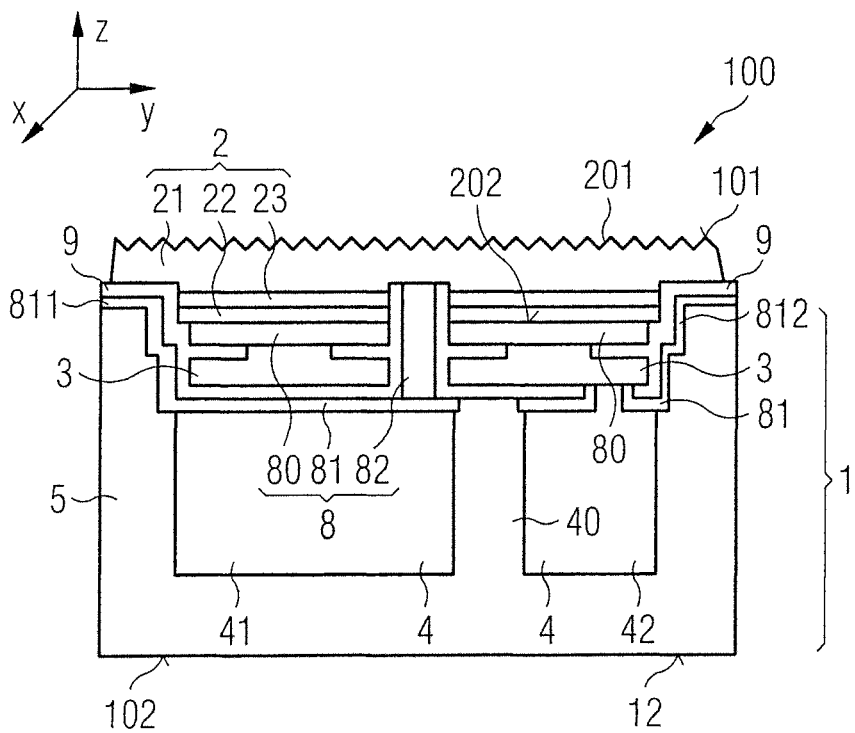

In FIG. 5B, a further example of a component is illustrated. The example illustrated in FIG. 5B substantially corresponds to the example illustrated in FIG. 5A.

In contrast thereto, the through-via 82 extends through the further metal layer 3. The further metal layer 3 and the insulating structure 9 here have a common opening, through which the through-via 82 extends. Unlike FIG. 5A, in which the further metal layer 3 is arranged between the electrically conductive layer 81 and the metal layer 4 in the vertical direction, the electrically conductive layer 81 in FIG. 5B is arranged between the metal layer 4 and the further metal layer 3.

Furthermore, the electrically conductive layer 81 is divided into a first sub-layer 811 and a second sub-layer 812, wherein the sub-layers 811 and 812 are spaced apart laterally from one another and thus electrically separated from one another in the region of the intermediate space 40. The first sub-layer 811 electrically connects, e.g., to the first subregion 41 and the second sub-layer 812, e.g., to the second subregion 42. According to FIG. 5B, the through-via 82 and the first sub-layer 811 are electrically separated from the further metal layer 3 and from the second sub-layer 812 by the insulating layer 9.

In both FIGS. 5A and 5B, the further metal layer 3 can be formed coherently, in particular in one piece. In FIG. 5A, the further metal layer 3 has an opening through which the second subregion 42 extends. In FIG. 5B, the further metal layer 3 has an opening through which the through-via 82 of the wiring structure 8 extends to electrically contact the first semiconductor layer 21. In FIG. 5A, the further metal layer 3 is thus configured to electrically contact the first semiconductor layer 21. In FIG. 5B, on the other hand, the further metal layer 3 is configured to electrically contact the second semiconductor layer 22. The further metal layer 3 in FIG. 5B can in addition be completely surrounded by the insulating structure 9 in lateral directions. According to FIGS. 5A and 5B, the semiconductor body 2 can be entirely surrounded by the insulating structure 9 in lateral directions, at least at a vertical height of the second semiconductor layer 22. The carrier 1 with the mold body 5 can also entirely surround the semiconductor body 2, e.g., at the vertical height of the second semiconductor layer 22 in lateral directions.

In FIG. 6, a device 700 with a component 100 on a printed circuit board 7 is illustrated. The printed circuit board 7 comprises one or a plurality of conducting tracks 71. The side face 10 of the carrier 1 or of the component 100 here is formed as a mounting surface. In other words, the component 100 can be attached to the printed circuit board 7 on the side face 10. By a connecting layer 70, a mechanical and electrical connection can be produced between the contact layer 400 and the conducting track 71. The contact layer 400 here can be the first contact layer 410 or the second contact layer 420. In particular, the component 100 comprises both a first contact layer 410 and a second contact layer 420 on the same side face 10. By a direct mechanical connection between the connecting layer 70 and the contact layer 400, heat dissipation can be controlled, e.g., by a contact layer 400 formed over a large area.

The device comprises a light guide 72 with a light entry surface. The component has, during operation of the device, a main emission direction that in particular runs parallel to the mounting surface 10 and thus parallel to the printed circuit board 7. The component 100 and the light guide 72 are arranged such that the main emission direction of the component 100 is oriented approximately perpendicularly to the light entry surface of the light guide 72. In particular, the light guide 72 and the component 100 can have a substantially equal installation height on the printed circuit board 7. The installation height of the light guide 72 can be, e.g., 50 to 250 µm, in particular 50 to 150 µm or, e.g., 50 to 100 µm.

By using a component having in particular a side face formed as a mounting surface, a high-performance light-emitting device for display backlighting can have a particularly thin configuration while at the same time being mechanically stable.

This application claims priority of DE 10 2015 109 755.9, the subject matter of which is incorporated herein by reference.

This description with the aid of the examples does not limit our components and methods thereto. Rather, this disclosure comprises any new feature and any combination of features, that in particular includes any combination of features in the appended claims, even if the feature or combination is not itself explicitly stated in the claims or examples.

The invention claimed is:

1. A component comprising a carrier and a semiconductor body arranged on the carrier, wherein
    the carrier has a front side facing towards the semiconductor body and a rear side facing away from the semiconductor body, wherein the carrier is formed from a mold body and a metal layer,
    the semiconductor body has a first semiconductor layer facing away from the front side of the carrier, a second semiconductor layer facing towards the front side of the carrier and an active layer arranged between the first semiconductor layer and the second semiconductor layer in a vertical direction,
    the metal layer has a first subregion configured to electrically contact the first semiconductor layer and a second subregion configured to electrically contact the second semiconductor layer, wherein the first subregion is spaced apart laterally from the second subregion by an intermediate space and thereby electrically separated,
    the mold body fills the intermediate space and has a surface extending in lateral directions that forms the rear side of the carrier, wherein the rear side of the carrier is free from the subregions of the metal layer,
    the carrier has a side face formed in places by a surface of the mold body extending in vertical directions, at least one of the subregions being formed such that electrical contact can be made by way of the side face, and
    the side face has a step, and the at least one of the subregions is formed such that external electrical contact can be made on the step.

2. The component according to claim 1, wherein the side face of the carrier is formed as a mounting surface of the component and external electrical contact can be made with the component by way of the mounting surface.

3. A method of producing a component comprising:
    a) providing a composite having a semiconductor layer stack, a metal layer and a mold body composite, wherein
        the semiconductor layer stack comprises at least one semiconductor body having a first semiconductor layer, a second semiconductor layer and an active layer arranged between the first and second semiconductor layers in a vertical direction,
        the metal layer comprises a first subregion that electrically contacts the first semiconductor layer and a second subregion that electrically contacts the second semiconductor layer, wherein the subregions are spaced apart laterally by an intermediate space and thereby electrically separated from one another, and
        the mold body composite covers the subregions of the metal layer completely in a top view of the semiconductor body and surrounds them entirely in the lateral directions, filling the intermediate space;
    b) forming at least one trench in the mold body composite starting from the side of the semiconductor layer stack to expose the first and/or second subregion of the metal layer; and
    c) forming an individual carrier for the one semiconductor body from the mold body composite and the metal layer such that the carrier has a side face formed in places by a side wall of the trench, wherein electrical contact can be made with the exposed subregion of the metal layer on the side face.

4. The component according to claim 1, wherein, in a top view of the front side of the carrier from the rear side, the mold body covers the first subregion and/or the second subregion of the metal layer completely.

5. The component according to claim 1, wherein the mold body is formed from an electrically insulating resin.

6. The component according to claim 1, wherein the mold body comprises light-scattering and/or light-reflecting particles embedded in an electrically insulating matrix material of the mold body.

7. The component according to claim 1, further comprising a metal layer arranged between the semiconductor body and the metal layer in a vertical direction, wherein in a top view of the rear side the further metal layer bridges the intermediate space laterally and thus mechanically reinforces the component in areas of the intermediate space.

8. The component according to claim 1, further comprising a through-via located in the semiconductor body in places and extends in a vertical direction through the second semiconductor layer and the active layer that electrically contacts the first semiconductor layer, wherein the through-via electrically connects to the first subregion of the metal layer.

9. A device comprising the component according to claim 1 and a printed circuit board, wherein
the side face of the carrier is formed as a mounting surface of the component such that the component is attached to the printed circuit board on the side face of the carrier and thereby electrically connected to the printed circuit board,
the active layer is configured to generate electromagnetic radiation during operation of the component, and
the component has a main emission direction during operation of the device running parallel to the mounting surface and thus to the printed circuit board.

10. The device according to claim 9 further comprising a light guide, wherein
the light guide has a light entry surface, and
the component and the light guide are arranged in relation to one another such that the main emission direction of the component is oriented approximately perpendicularly to the light entry surface of the light guide.

11. The method according to claim 3, wherein the side face has a step, and the at least one of the subregions is formed such that external electrical contact can be made on the step.

12. The method according to claim 3, wherein
the composite comprises a plurality of laterally spaced apart metal layers and semiconductor bodies and a plurality of isolating trenches between the semiconductor bodies of the components to be produced,
a plurality of trenches are formed in the mold body composite along the isolating trenches and beside the semiconductor bodies such that a plurality of first and/or second subregions are exposed on side walls of the trenches, and
the composite is singulated into a plurality of components after exposure of the first and/or second subregions such that the singulated components each comprise an individual carrier and a semiconductor body arranged on the carrier, wherein the individual carrier is formed from the singulated mold body composite and one of the metal layers with a first subregion and a second subregion.

13. The method according to claim 3, wherein, before the individual carrier is formed, both the side wall and a bottom face of the trench are formed by a surface of the first subregion and/or a surface of the second subregion.

14. The method according to claim 3, wherein the mold body composite is deposited on and around the metal layer by a molding method and the mold body composite is sawn from the side of the semiconductor layer stack to form the trench.

15. The method according to claim 3, wherein the metal layer is deposited on the semiconductor layer stack in a patterned manner by an electroplating or an electroless coating method.

16. The method according to claim 3, wherein, before the individual carrier is formed, an electrically conductive contact layer is deposited on the exposed subregion of the metal layer, and the contact layer comprises a precious metal.

* * * * *